(12) United States Patent
Nagy et al.

(10) Patent No.: US 6,530,231 B1
(45) Date of Patent: Mar. 11, 2003

(54) THERMOELECTRIC ASSEMBLY SEALING MEMBER AND THERMOELECTRIC ASSEMBLY INCORPORATING SAME

(75) Inventors: Michael J. Nagy, Traverse City, MI (US); Todd M. Ritzer, Traverse City, MI (US); Paul G. Lau, Traverse City, MI (US)

(73) Assignee: TE Technology, Inc., Traverse City, MI (US)

(*) Notice: Subject to any disclaimer, the term of this patent is extended or adjusted under 35 U.S.C. 154(b) by 0 days.

(21) Appl. No.: 09/955,501

(22) Filed: Sep. 18, 2001

Related U.S. Application Data

(60) Provisional application No. 60/234,727, filed on Sep. 22, 2000.

(51) Int. Cl.[7] ............................ F25B 21/02; H01L 35/28
(52) U.S. Cl. .................................... 62/3.2; 136/203
(58) Field of Search ............................. 62/3.2, 3.3, 3.6, 62/3.7; 136/203, 224, 225, 230, 237

(56) References Cited

U.S. PATENT DOCUMENTS

| | | | |
|---|---|---|---|
| 2,938,357 A | 5/1960 | Sheckler .......................... 62/3 |
| 2,997,514 A | 8/1961 | Roeder, Jr. ..................... 136/4 |
| 3,075,360 A | 1/1963 | Elfving et al. .................. 62/3 |
| 3,167,925 A | 2/1965 | Elfving ............................ 62/3 |
| 3,212,274 A | 10/1965 | Eidus ............................. 62/3 |
| 3,225,549 A | 12/1965 | Elfving ............................ 62/3 |
| 3,229,469 A | 1/1966 | Katon ............................. 62/3 |
| 3,246,920 A | 4/1966 | Pall ............................ 285/237 |
| 3,325,312 A | 6/1967 | Sonntag, Jr. ................. 136/212 |
| 3,390,018 A | 6/1968 | Habdas ........................ 136/204 |
| 3,411,955 A | 11/1968 | Weiss .......................... 136/205 |
| 3,472,523 A | 10/1969 | Rentschler et al. ......... 277/209 |
| 3,489,520 A | 1/1970 | Chartouni et al. ............. 23/253 |
| 3,873,102 A | 3/1975 | Lotze et al. ..................... 277/2 |
| 4,168,394 A | 9/1979 | Yuey ............................ 174/151 |
| 4,383,414 A | 5/1983 | Beitner ............................. 62/3 |
| 4,493,939 A | 1/1985 | Blaske et al. ................ 136/212 |
| 4,782,664 A | 11/1988 | Sterna et al. ..................... 62/3 |
| 4,829,771 A | * 5/1989 | Koslow et al. ............... 62/3.64 |
| 4,831,083 A | 5/1989 | Geri et al. ................... 525/199 |
| 5,032,472 A | 7/1991 | Michel et al. ............... 428/704 |
| 5,047,212 A | 9/1991 | Blades et al. ............. 422/82.02 |
| 5,275,957 A | 1/1994 | Blades et al. ................ 436/133 |
| 5,344,493 A | 9/1994 | Jackson .......................... 134/1 |
| 5,367,879 A | 11/1994 | Doke et al. .................... 62/3.6 |
| 5,501,076 A | * 3/1996 | Sharp, III et al. ............. 62/3.6 |
| 5,540,450 A | 7/1996 | Hayashi et al. ............. 277/205 |

(List continued on next page.)

FOREIGN PATENT DOCUMENTS

| | | |
|---|---|---|
| DE | 2009940 | 9/1970 |
| JP | 06294562 A | * 10/1994 |

*Primary Examiner*—Chen-Wen Jiang
(74) *Attorney, Agent, or Firm*—Van Dyke, Gardner, Linn & Burkhart, LLP

(57) ABSTRACT

A sealing member for a thermoelectric assembly includes an elastomeric body having one or more apertures formed therethrough for sealingly receiving an electrical wire projecting from the thermoelectric module. Sealing engagement between each electrical wire and each aperture may be enhanced by the use of a sealing agent, or by molding the wire, its sheath or a wire connector to each aperture. Preferably, a pair of wire guides project from the sealing member, each having a central channel in substantial registry with one of the apertures and providing additional surface area for wire support which reduces any tendency to create spaces between the wires and apertures. The sealing member may include one or more peripheral channels to capture water vapor, one or more indexing guides which receive fasteners from the assembly to locate the sealing member therein, as well as insulative filler material, and/or a central insulative channel.

20 Claims, 6 Drawing Sheets

U.S. PATENT DOCUMENTS

| | | | |
|---|---|---|---|
| 5,564,716 A | 10/1996 | Onoue et al. | 277/209 |
| 5,605,048 A | 2/1997 | Kozlov et al. | 62/3.7 |
| 5,607,167 A | 3/1997 | Franckx | 277/72 |
| 5,640,407 A | 6/1997 | Freyman et al. | 372/36 |
| 5,720,487 A | 2/1998 | Kato | 277/101 |
| 5,738,498 A | 4/1998 | Allington et al. | 417/53 |
| 5,813,233 A | 9/1998 | Okuda et al. | 62/3.7 |
| 5,822,993 A | 10/1998 | Attey | 62/3.7 |
| 5,841,064 A | 11/1998 | Maekawa et al. | 136/203 |
| 5,931,000 A | 8/1999 | Turner et al. | 62/3.2 |
| 5,939,464 A * | 8/1999 | Wang | |

* cited by examiner

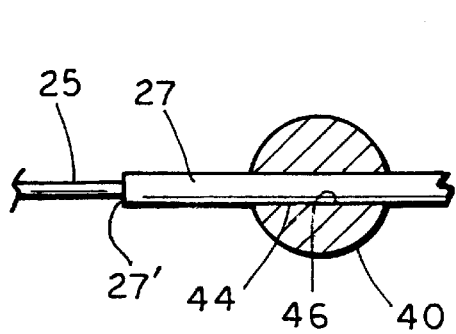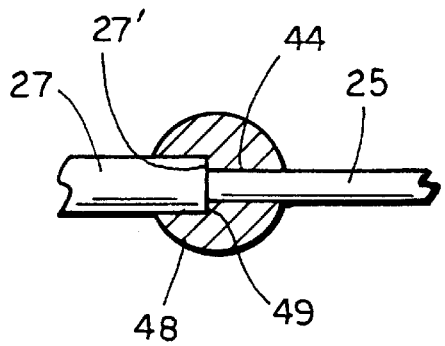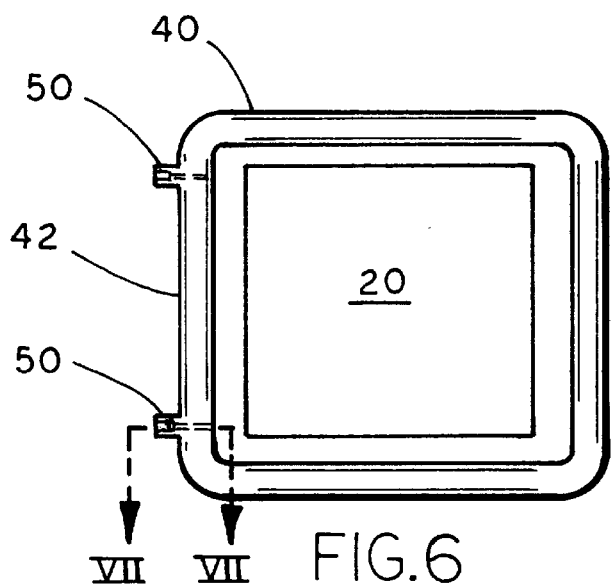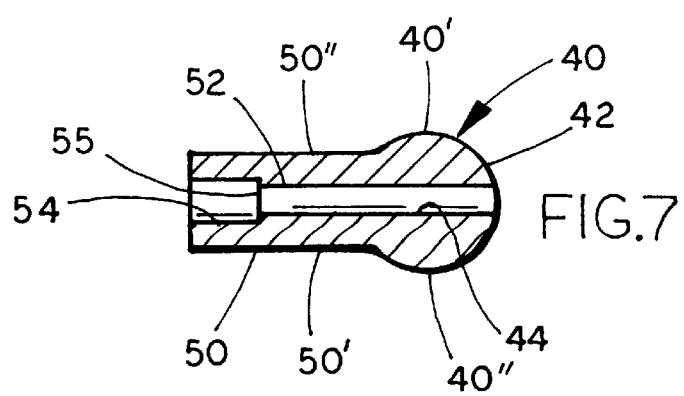

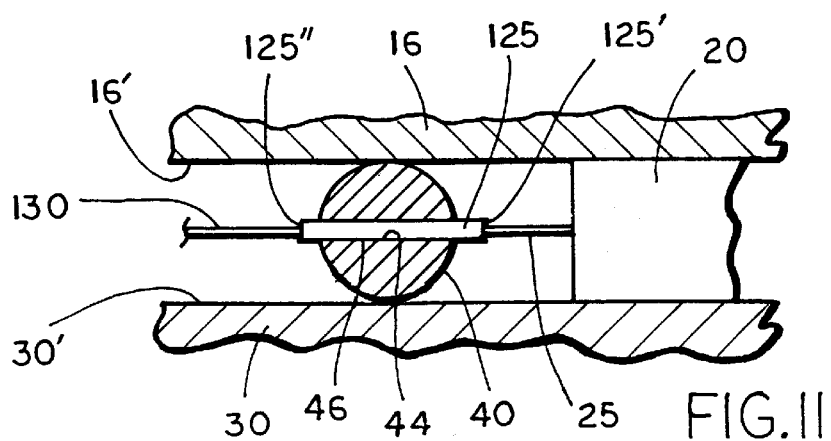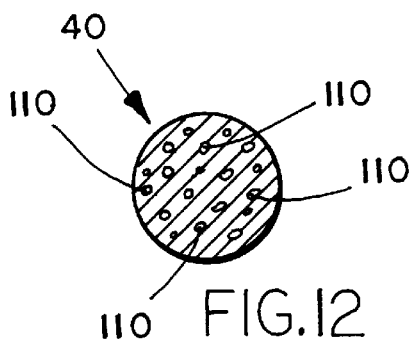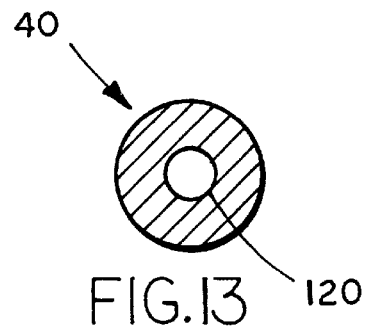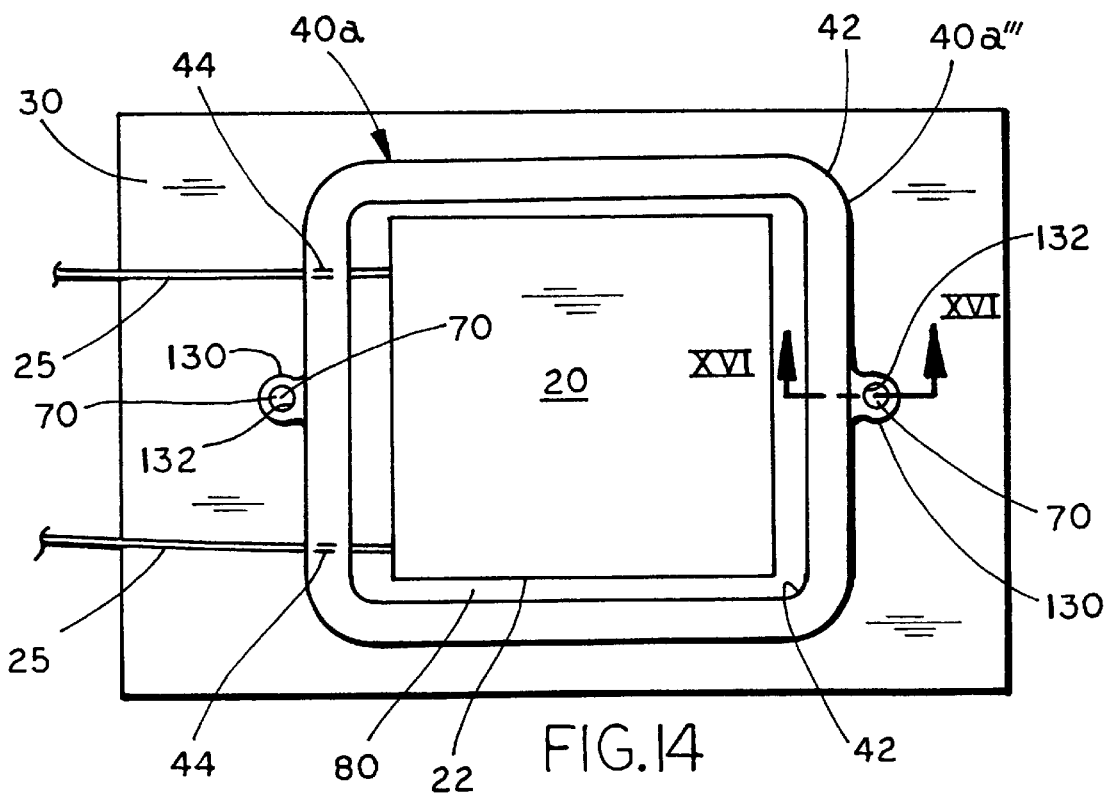

THERMOELECTRIC ASSEMBLY SEALING MEMBER AND THERMOELECTRIC ASSEMBLY INCORPORATING SAME

CROSS REFERENCE TO RELATED APPLICATION

This application claims priority from U.S. Provisional Patent Application Serial No. 60/234,727, filed Sep. 22, 2000, the disclosure of which is hereby incorporated by reference herein in its entirety.

BACKGROUND OF THE INVENTION

The present invention is directed generally to thermoelectric assemblies, and in particular, to a sealing member for the thermoelectric module of a thermoelectric assembly.

Thermoelectric assemblies are solid state heat pumps that extract or add heat to an object or region, and so can be used for cooling or heating, depending on the specific application. They can also be used to generate electrical current. Such thermoelectric assemblies are currently used in a wide variety of applications in order to affect the thermal environment of a particular object or region. In its broadest form, a thermoelectric assembly includes a cold side heat exchanger, or "cold sink", and a hot side heat exchanger or "heat sink". A thermoelectric module, often referred to as a Peltier Effect Module, is positioned or sandwiched between the inner surfaces of both the cold sink and the heat sink. The thermoelectric module uses electrical current to create a temperature difference between the heat sink and cold sink, or can generate electrical current from an imposed temperature difference between the heat sink and cold sink.

Variations in, and additions to, the basic components enable a thermoelectric assembly to be tailored to a specific application. For example, when used to cool air in electronic enclosures, medical cabinets, small refrigerators, environmental chambers, battery boxes, mini-bars, picnic boxes, or vending machines, thermoelectric assemblies are referred to "air-to-air coolers" and include a fan attached to both the heat sink and the cold sink. The cold sink is positioned within the region to be cooled such as the interior of a refrigerator, while the heat sink is positioned exterior to the controlled region. Air is drawn into the assembly by the fan attached to the cold sink and recirculates cooled air within the controlled region, while the fan attached to the heat sink draws in ambient air and exhausts heated air to the external environment.

In "plate-to-air" type thermoelectric assemblies, often used in conjunction with laser diodes, CPU coolers, liquid reservoirs, temperature baths, water coolers, gene cloning equipment, aquariums, and beverage coolers, the cold sink is in the form of a plate which is in direct thermal and/or mechanical contact with the region to be cooled.

In still another form, thermoelectric assemblies are referred to as "plate-to-plate" and are used, for example, in detectors, sensors, CCD's, small laser diodes, integrated circuits, and lamps, both the hot and cold sink are plates. The object or region is cooled with direct contact to the cold plate, while the plate-style heat exchanger on the hot side is attached to a secondary heat sink.

In "liquid-to-air" thermoelectric assemblies, a serpentine-shaped liquid conduit is attached to the cold plate. Heated fluid travels into the input of the liquid conduit, and heat exchange is accomplished while the conduit is in contact with the cold plate. The fluid outlet of the liquid conduit transports the cooled fluid to a region in which it is utilized, while heat is exhausted by the heat sink. Such liquid-to-air thermoelectric assemblies are utilized in, for example, therapy pads for medical treatment, laser chillers, cooling process fluids, temperature baths, and semi-conductor processing equipment.

The reliability of all types of thermoelectric modules and also the efficiency of the thermoelectric assembly is dependent upon its ability to effectively transfer heat between the cold sink and the heat sink. This ability is severely compromised by the introduction of water vapor to the thermoelectric module. Specifically, when water vapor is allowed to condense within the thermoelectric module, interaction between the condensed water and the thermoelectric module causes the module to corrode, and over time, leads to catastrophic failure. Thus, it is critical that an effective hermetic seal be formed about the thermoelectric module.

Existing sealing methods are ineffective for a variety of reasons. In many designs, a seal is achieved by the use of some form of sealing agent surrounding the thermoelectric module. The sealing agents, over time, given their chemical composition, are susceptible to degradation, which will eventually permit water vapor to penetrate the seal and deleteriously impact the thermoelectric module. Also, some thermoelectric assemblies employ an O-ring having apertures formed to accept the electrical wires necessary to power the thermoelectric module. These wires are stranded, and as such permit the intrusion of vapor through the interstices formed between the stranded wires. Also, in order to secure the thermoelectric module between the cold sink and the heat sink, fasteners are employed to provide a secure connection. Often, the fasteners used to secure the particular components of the thermoelectric assembly are positioned through the sealing agents or O-rings. Alternatively, such fasteners are located within the area defined between the inner surface of the sealing agent or O-ring, and the thermoelectric module. These fasteners require the use of an annulus or aperture in which they are fitted, and due to manufacturing tolerances, provide intrusion sites through which water vapor may penetrate and eventually condense at the thermoelectric module. Still further, other sealing methods, given their structure and configuration, are cost prohibitive.

Consequently, there exists a need within the industry for a sealing member for a thermoelectric assembly which provides a reliable, effective hermetic seal about the thermoelectric module, and which is cost effective to manufacture.

SUMMARY OF THE INVENTION

According to one aspect of the invention, a sealing member for a thermoelectric assembly having a thermoelectric module with a periphery and at least one wire projecting therefrom, and positioned between a first heat exchanger and a second heat exchanger comprises an elastomeric member, having a low water vapor permeability, and configured to sealingly engage the first heat exchanger and the second heat exchanger, and is adapted to be positioned beyond the periphery of the thermoelectric module. The elastomeric member has a first surface adapted to engage a surface of the first heat exchanger and an opposing second surface, adapted to engage a surface of the second heat exchanger. Each surface of the elastomeric member is formed with at least one peripheral channel. At least one aperture is formed within the elastomeric member and is dimensioned to sealingly receive the wire from the thermoelectric module. The at least one aperture has a substantially uniform cross section.

The utilization of an elastomeric material having a low water permeability increases the reliability of the sealing member. Furthermore, the peripheral channels formed within the elastomeric member provide capturing sites which effectively trap water vapor and prevent the same from migrating towards the thermoelectric module. Moreover, the uniform cross-section of the aperture increases the reliability of the seal between the aperture and the wire.

According to yet another aspect of the invention, a thermoelectric assembly includes a thermoelectric module having a pair of opposing surfaces, a periphery, and at least one electrical wire projecting therefrom. The thermoelectric module is positioned between a first and second heat exchanger, while a sealing member is positioned beyond the periphery of the thermoelectric module. The sealing member has a first sealing surface which sealingly engages the first heat exchanger, and a second sealing surface which sealingly engages the second heat exchanger. The sealing member is formed with at least one aperture having a generally uniform cross-section, and is dimensioned to receive the at least one electrical wire projecting from the thermoelectric module. A wire guide projects from the sealing member in a direction away from the thermoelectric module, and has a central channel. The central channel is substantially axially aligned with the aperture, and is dimensioned to receive the at least one wire.

Providing a wire guide projecting from the sealing member increases the distribution of forces exerted on the wire across a greater surface area. As the forces exerted on the wire are distributed over a greater surface, there is less of a tendency for the wire to move in a direction normal to the axial direction of the central channel and thus create an interstice between the channel and the wire through which vapor may penetrate.

According to still another aspect of the invention, a thermoelectric assembly includes a thermoelectric module positioned between a first and second heat exchanger. A sealing member is positioned about the periphery of the thermoelectric module and sealingly engages the inner surface of the first and second heat exchanger. At least one fastener extends between the first and second heat exchanger and is positioned beyond the outer surface of the sealing member.

Positioning the at least one fastener beyond the outer surface of the sealing member eliminates the probability for the intrusion of water vapor due to placement of the fastener within the area defined between the thermoelectric module and the inner surface of the sealing member, or the placement of a fastener through the sealing member itself.

According to still a further aspect of the invention, a thermoelectric assembly includes a thermoelectric module positioned between a first and second heat exchanger. The thermoelectric module has at least one wire projecting therefrom, the wire having a section surrounded by a polymeric material. A sealing member is positioned about the periphery of the thermoelectric module and has a pair of sealing surfaces which engage the first and second heat exchanger. The sealing member is formed with an aperture dimensioned to receive the at least one wire. The aperture defines a wall therearound and the polymeric material is molded to the wall. Molding the polymeric material which surrounds at least a section of the wire to the wall of the sealing member increases the sealing engagement therebetween and prevents water vapor from passing therethrough and impacting the thermoelectric module.

In another aspect of the invention, a thermoelectric assembly employs an electrical connector member molded directly to the aperture of the sealing member. In this embodiment, the at least one wire of the thermoelectric assembly is connected to the electrical connector member.

According to a further aspect of the invention, a sealing member for a thermoelectric assembly having a thermoelectric module with a periphery and at least one wire projecting therefrom, and positioned between a first heat exchanger and a second heat exchanger comprises an elastomeric member, having a low water vapor permeability, and configured to sealingly engage the first heat exchanger and the second heat exchanger, and is adapted to be positioned beyond the periphery of the thermoelectric module. The elastomeric member has first surface adapted to engage a surface of the first heat exchanger and an opposing second surface adapted to engage a surface of the second heat exchanger. At least one aperture is formed within the elastomeric member and is dimensioned to sealingly receive the at least one wire. Additionally, the elastomeric member is formed having a thermally insulative filler material homogeneously disbursed therein. This thermally insulative filler material reduces the heat loss through the elastomeric member and increases the efficiency of the thermoelectric assembly.

According to yet a further aspect of the invention, a sealing member for a thermoelectric assembly having a thermoelectric module with a periphery and at least one wire projecting therefrom, and positioned between a first heat exchanger and a second heat exchanger comprises an elastomeric member, having a low water vapor permeability, and configured to sealingly engage the first heat exchanger and the second heat exchanger. The sealing member is adapted to be positioned beyond the periphery of the thermoelectric module. The elastomeric member is formed with a central channel and has a first surface adapted to engage a surface of the first heat exchanger and an opposing second surface, adapted to engage a surface of the second heat exchanger. At least one aperture is formed within the elastomeric member and is dimensioned to sealingly receive the at least one wire. The central channel of the elastomeric member provides a thermally insulative barrier, and reduces the heat loss across the sealing member which in turn increases the efficiency of the thermoelectric assembly.

Yet another form of the sealing member may include one or more indexing guides which receive fasteners from the thermoelectric assembly and facilitate proper positioning of the sealing member in the assembly.

These and other objects, advantages, purposes and features of the invention will become apparent upon review of the following specification in conjunction with the drawings.

BRIEF DESCRIPTION OF THE DRAWINGS

FIG. 4 is a cross-sectional view taken along the line IV—IV of FIG. 3;

FIG. 5 is the same view as FIG. 4, depicting an aperture according to an alternative preferred embodiment;

FIG. 6 is a plan view of a sealing member and thermoelectric module according to another alternative preferred embodiment;

FIG. 7 is a cross-sectional view taken along line VII—VII of FIG. 6;

FIG. 11 is a sectional view illustrating a sealing member with an electrical connector positioned within an aperture and connected to a thermoelectric module, according to an alternative preferred embodiment;

FIG. 12 is a sectional view of a sealing member according to yet another alternative preferred embodiment; and FIG. 13 is the same view as FIG. 12, according to still another alternative preferred embodiment;

FIG. 14 is a plan view of an alternate embodiment of a sealing member and thermoelectric module according to the present invention;

DETAILED DESCRIPTION OF THE PREFERRED EMBODIMENTS

The present invention advances a sealing member for a thermoelectric module, and a thermoelectric assembly formed thereby. The sealing member of the present invention reliably and effectively prevents water vapor from contacting the thermoelectric module and hence, prevents premature degradation. The sealing member of the present invention is economical to manufacture, and can be manufactured in any size to thereby effectively seal thermoelectric modules of different dimensions.

Figure 2:
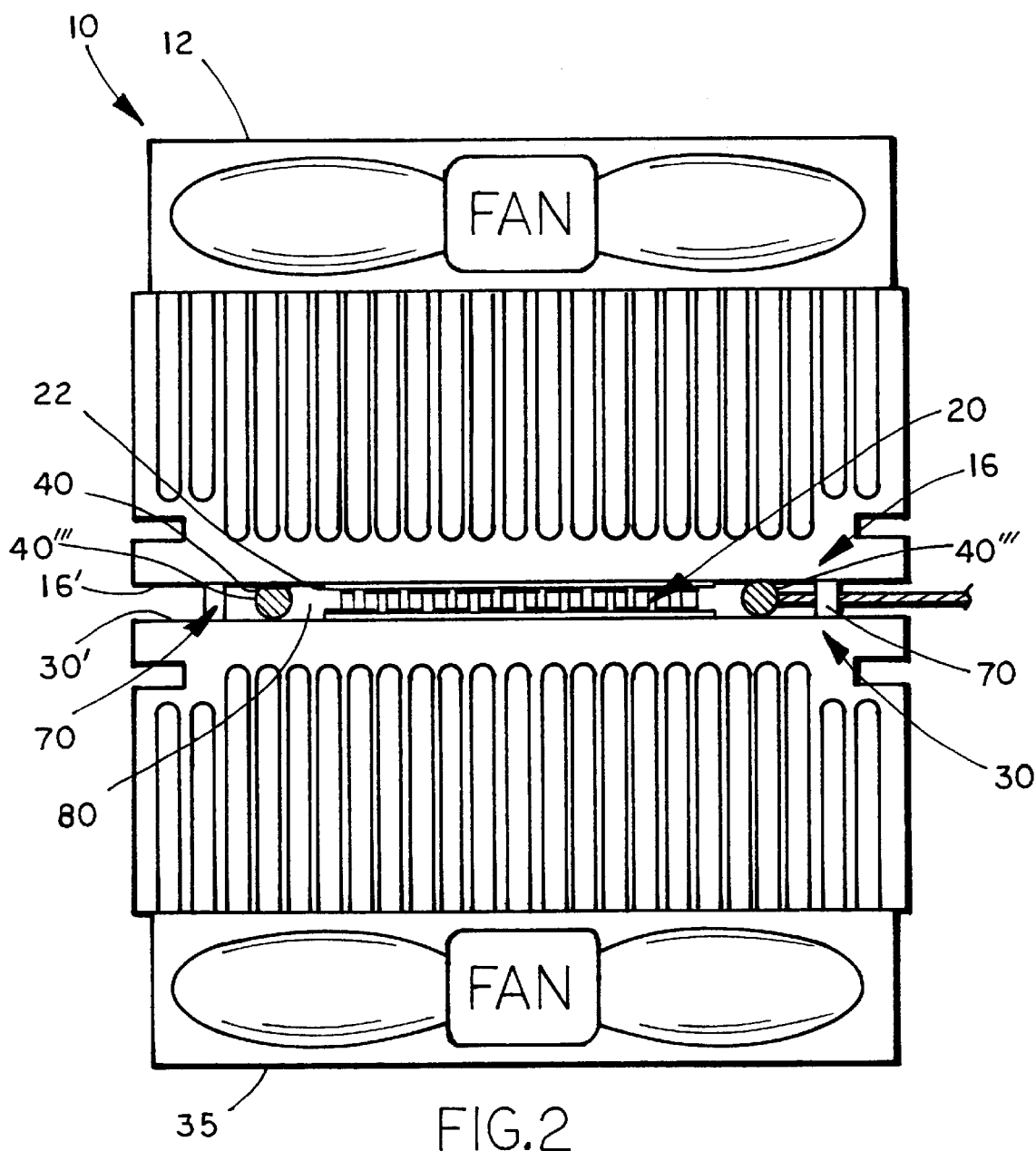
FIG. 2 is a cross-sectional view of the thermoelectric assembly of FIG. 1.

Referring now to the drawings, wherein like reference numerals refer to like elements in the several drawings, a thermoelectric assembly 10 includes a first or input fan 12 coupled to a first heat exchanger or cold sink 16. Contact surface 16' of cold sink 16 is in contact with thermoelectric module 20 (FIG. 2). The opposing side of thermoelectric module 20 is in contact with contact surface 30' of a second heat exchanger or heat sink 30. The opposing side of heat sink 30 is coupled to an exhaust fan 35. A sealing member 40 surrounds, and hermetically seals, thermoelectric module 20. It will be recognized that although one thermoelectric module 20 is illustrated in the drawings, one sealing member 40 may be used to seal several thermoelectric modules 20 placed in proximity and electrically connected to one another.

Figure 1:
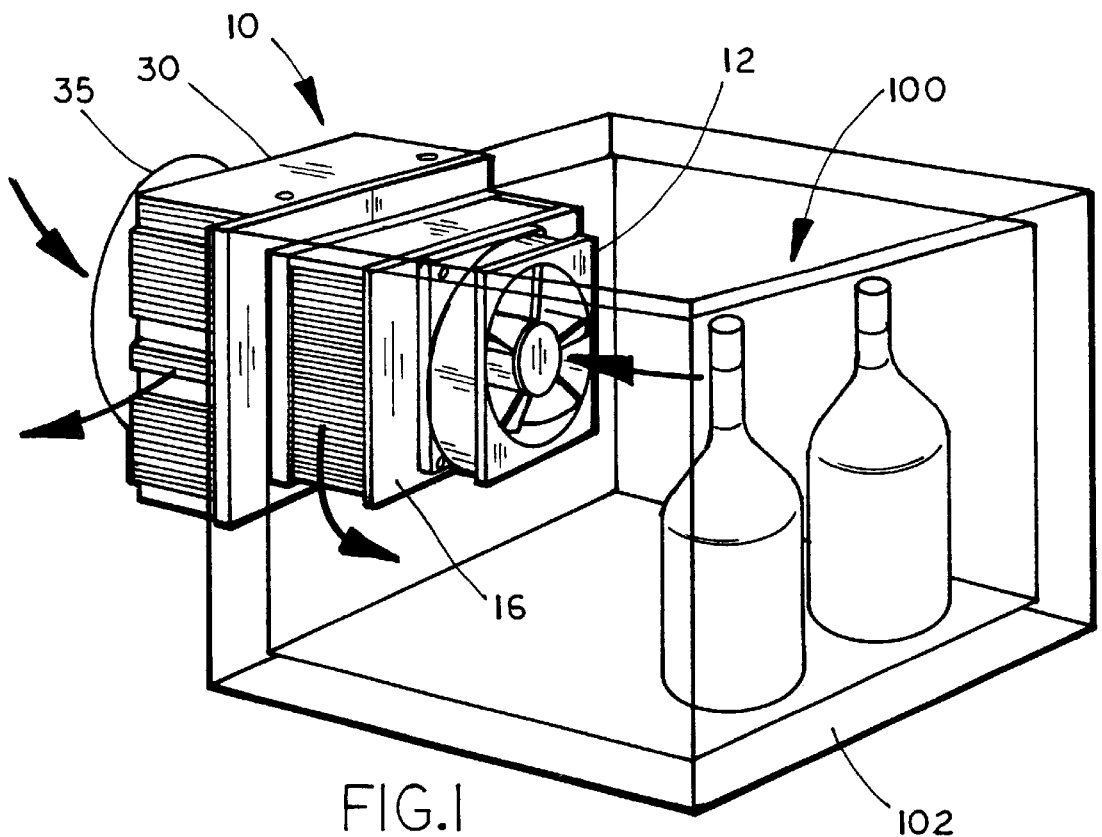
FIG. 1 is a perspective view of a thermoelectric assembly mounted to a refrigeration unit, according to the invention.

In operation, air is drawn through cold sink 16 by input fan 12 and is recirculated into a region 100 which is to be cooled. As depicted in FIG. 1, region 100 is the interior of a refrigeration cabinet 102; however, it will be recognized that other regions 100 may be cooled by thermoelectric assembly 10. As air from input fan contacts cold sink 16, thermoelectric module 20 thermoelectrically absorbs heat therefrom and transfers the same to heat sink 30, which is subsequently exhausted to the environment by exhaust fan 35. Thermoelectric module 20 may be any thermoelectric module normally employed in thermoelectric assemblies.

It will be recognized by those with ordinary skill in the art that the above description of thermoelectric assembly 10 is but one form, specifically, an air-to-air thermoelectric assembly, and shall not be limiting of the invention. The present invention is also applicable to plate-to-plate thermoelectric assemblies, wherein cold sink 16 and heat sink 30 are replaced by plates; plate-to-air thermoelectric assemblies, wherein only cold sink 16 is replaced by a plate; or liquid-to-air thermoelectric assemblies, wherein a serpentine liquid channel is in contact with cold sink 16. Thus, it will be realized, that the present invention may be used in conjunction with any form of thermoelectric assembly, and that the above description is for illustrative purposes only.

As shown in FIG. 2, sealing member 40 is positioned beyond the periphery 22 of thermoelectric module 20 and is in sealing contact with contact surface 16' of cold sink 16 and contact surface 30' of heat sink 30. Sealing member 40 provides a hermetic seal, preventing water vapor from entering the area within sealing member 40 and condensing on thermoelectric module 20 which could otherwise cause premature degradation thereof.

In a preferred embodiment, sealing member 40 is made of an elastomeric material which has low water vapor permeability. Preferably, sealing member 40 is made of a butyl rubber, or a terpolymer elastomer made from ethylene-propylene diene monomer, by any manufacturing method normally employed in the art. Most preferably, sealing member is made of a fluoroelastomer, specifically, a copolymer of vinylidene fluoride and hexafluoropropylene, which is, sold under the trademark VITON by DuPont Chemical Corporation. As depicted in the several figures, such as FIG. 3, sealing member 40 is a continuous, closed shape that is generally rectangular in this embodiment and has arcuate or curved corners 42. The purpose of curved corners 42 is to avoid the presence of hard angles which compromise the ability of sealing member 40 to provide a hermetic seal. It will be understood by those with ordinary skill in the art that although depicted with a rectangular shape, sealing member 40 may assume any shape required by the particular application. For example, depending upon the peripheral dimension of thermoelectric module 20, sealing member 40 may assume a generally circular or oval shape. Further, it will be understood that sealing member 40 may be made to assume any size required by the particular thermoelectric module 20 which is to be sealed.

Alternately, sealing member 40 may be formed in place on the surface of one of the heat exchanger, heat sink or cold sink plates by dispensing sealing or gasket material from a suitable dispensing apparatus or machine in a suitable closed, continuous shape extending around the entirety of one or more thermoelectric modules to be hermetically sealed. Similarly, sealing member 40 may be extruded into a desired shape for use in a thermoelectric assembly as described herein.

In an alternative preferred embodiment, as depicted in FIG. 12, sealing member 40 may be formed such that it has a thermally insulative filler material 110 homogeneously disbursed therethrough. Thermally insulative filler material 110 decreases the heat loss across sealing member 40, and thus increases the efficiency of thermoelectric assembly 10. In a preferred embodiment, thermally insulative filler material 110 is a plurality of small, hollow beads or microspheres formed from plastic, glass, ceramic or another thermally insulative material and containing a gas such as air. In one form, thermally insulative filler material 110 may be hollow glass beads or microspheres manufactured under the trademark SCOTCHLITE by 3M Corporation of St. Paul, Minn. In another form, thermally insulative filler material 110 may be plastic microspheres sold under the trademark EXPANCELL by Casco Products of Sundsvall, Sweden.

In still another alternative embodiment, shown in FIG. 13, sealing member 40 is formed having a central insulative channel 120. Central channel 120 is a pocket or space closed to the exterior of but positioned within and extending along the entire length of sealing member 40. Channel 120 preferably has a circular cross-sectional shape although other shapes including square or hexagonal are also possible. Central channel 120, like thermally insulative filler material 110, increases the insulative ability of sealing member 40 and thus reduces heat loss. Preferably, central channel 120 is filled with a gaseous substance such as air. Apertures 44 receiving wires form thermoelectric module 20 may extend through central channel 120 or through the elastomeric material of sealing member 40 adjacent central channel 120.

Figure 3:
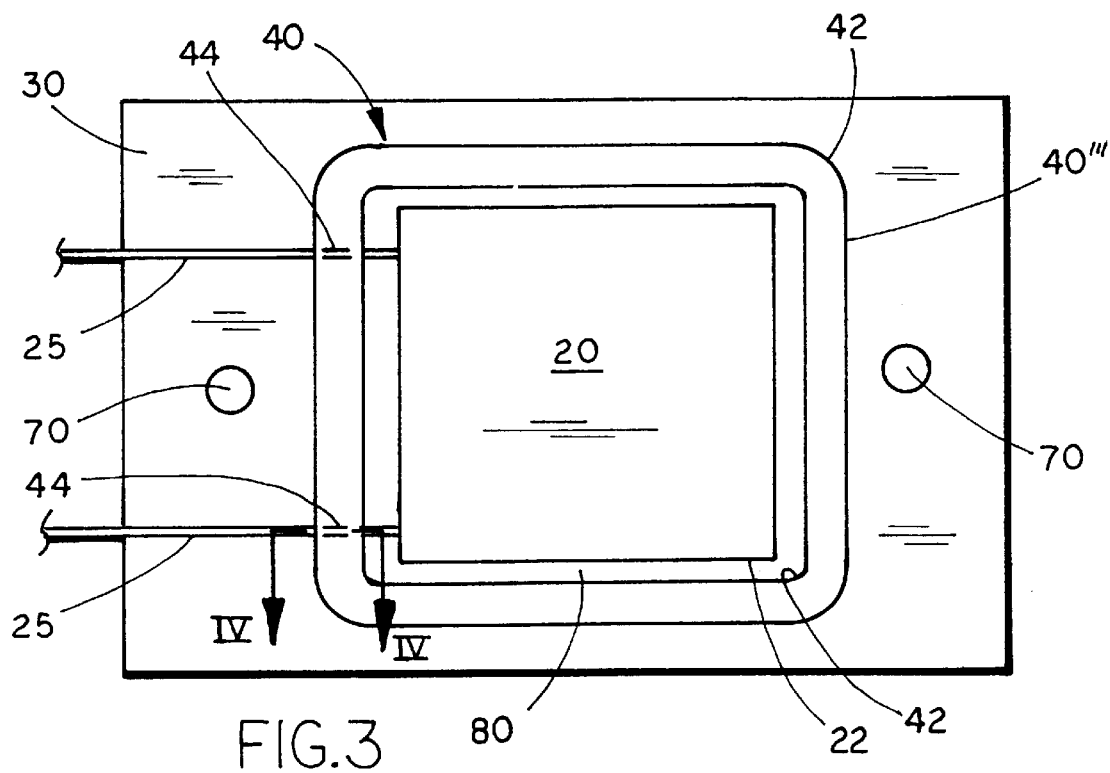
FIG. 3 is a plan view of a sealing member and thermoelectric module according to a preferred embodiment.

With reference to FIGS. 3 through 5, in one preferred form, sealing member 40 has a generally circular, uniform cross-section and is formed with a pair of generally circular slots or apertures 44 which extend completely through the sealing member in a direction transverse to the axial extent of the sealing member. Apertures 44 are dimensioned to sealingly receive electrical wires 25 projecting from thermoelectrical module 20. Electrical wires 25, at their ends, are connected to a power source (not shown), and preferably are solid wires, such as from copper, not stranded or twisted composite wires. Apertures 44 are formed of a substantially uniform cross section. That is, wall 46 formed by aperture 44 contains no ribs or projections extending within aperture 44. Preferably, in one form, apertures 44 have a diameter or cross-sectional size having the same shape as solid wire 25 but a slightly smaller size such that wall 46 frictionally receives, tightly grips, and seals against the wire for a secure hermetic seal. In another preferred embodiment, as shown in FIGS. 4 and 5, electrical wires 25 are at least partially encased within a polymeric cover or sheath 27 which fits tightly around wire 25 and is molded to wall 46. Molding the polymeric material of sheath 27 to walls 46 provides a reliable hermetic seal therebetween which prevents the intrusion of water vapor through apertures 44. Alternatively, sheath 27 may be eliminated and wire 25 directly molded to wall 46.

As shown in FIG. 11, in an alternative preferred embodiment, an electrically conductive connector member 125, such as copper, is molded to wall 46 of aperture 44 during the manufacturing of sealing member 40. End 125' of electrical connector member 125 is electrically coupled to wire 25 projecting from thermoelectric module 20, while end 125" is electrically coupled to a wire 130, which in turn, is connected to a power source (not shown).

Alternatively, and with reference to FIG. 4, a sealing agent such as, for example, a glue or adhesive is positioned on the external surface 27' of sheath 27 and chemically adheres to walls 46. Alternatively, a vacuum grease or other agent which enhances hermetization is employed to provide a seal between sheath 27 and walls 46.

Turning now to FIG. 5, in an alternative preferred embodiment, apertures 44 are formed with a section of increased diameter 48. In this embodiment, section 48 is sized such that it frictionally receives sheath 27, while end 27' of sheath 27 abuttingly contacts wall 49 formed by section 48, while electrical wire 25 extends through aperture 44. Sheath 27 may be sealingly engaged with wall 49 formed by section 48 as well as the remainder of section 48 by any means discussed above. Preferably, wires 25 are solid wire as opposed to a stranded or bundled set of individual wires. Employing a solid material for wires 25 eliminates the intrusion of water vapor between the individual strands of a stranded wire.

With reference to FIGS. 6 and 7, in an alternative preferred embodiment, sealing member 40 includes a pair of wire guides 50 projecting from outer surface 42 of sealing member 40. Wire guides 50 are formed with a central channel 52 and have a height measured from surface 50' to surface 50" which is less than the height of sealing member 40 as measured from contact surface 40' to contact surface 40". Central channel 52 is preferably axially aligned with aperture 44 through sealing member 40 and is formed with a section 54 having an increased diameter. Section 54 of central channel 52 defines an end wall 55 which sealingly engages end 27' of sheath 27, while wire 25 extends through central channel 52 and aperture 44. Preferably, sealing member 40 and wire guides 50 are molded in a one piece, unitary construction. Alternatively, central channel 52 may be of uniform cross section, which sealingly accepts sheath 27 of wire 25 and is sealingly engaged thereto by any method detailed hereinabove.

Wire guides 50 are of a pre-selected length, and distribute the forces exerted on electrical wire 25 over a greater surface area. Because the forces on wires 25 are distributed over a greater area, there is less of a tendency of wires 25 to bend within wire guides 50, and prevents the formation of an interstice area between the external surface of sheath 27 and the wall defined by central channel 52, and hence prevents the potential for the introduction of water vapor therethrough. Furthermore, when thermoelectric assembly 10 is assembled, as will be discussed in detail below, wire guides 50, given their lesser height than sealing member 40, are not compressed by cold sink 16 and heat sink 30, thus eliminating the possibility that wire guides 50 and central channel 52 will be spatially deformed by compression, and avoiding any compromise of the hermetic seal between central channel 52 and wire 25.

Figure 8:
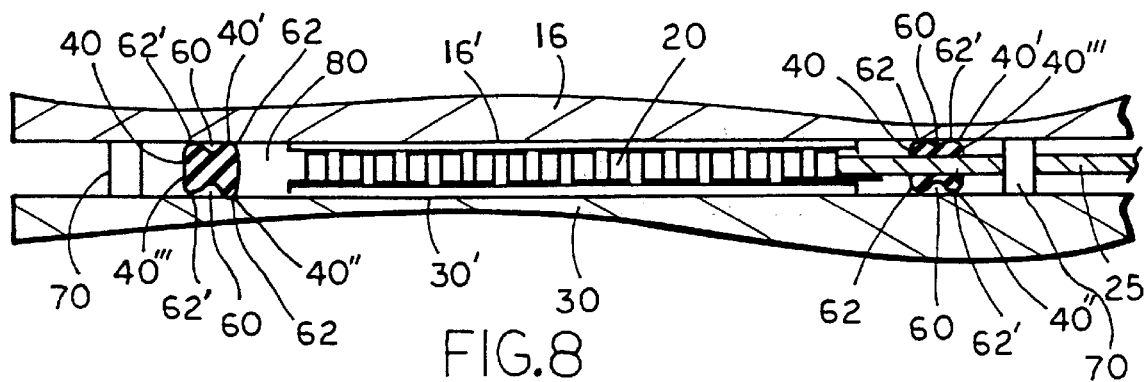
FIG. 8 is a sectional view depicting a sealing member and thermoelectric module according to still another preferred embodiment.
Figure 9:
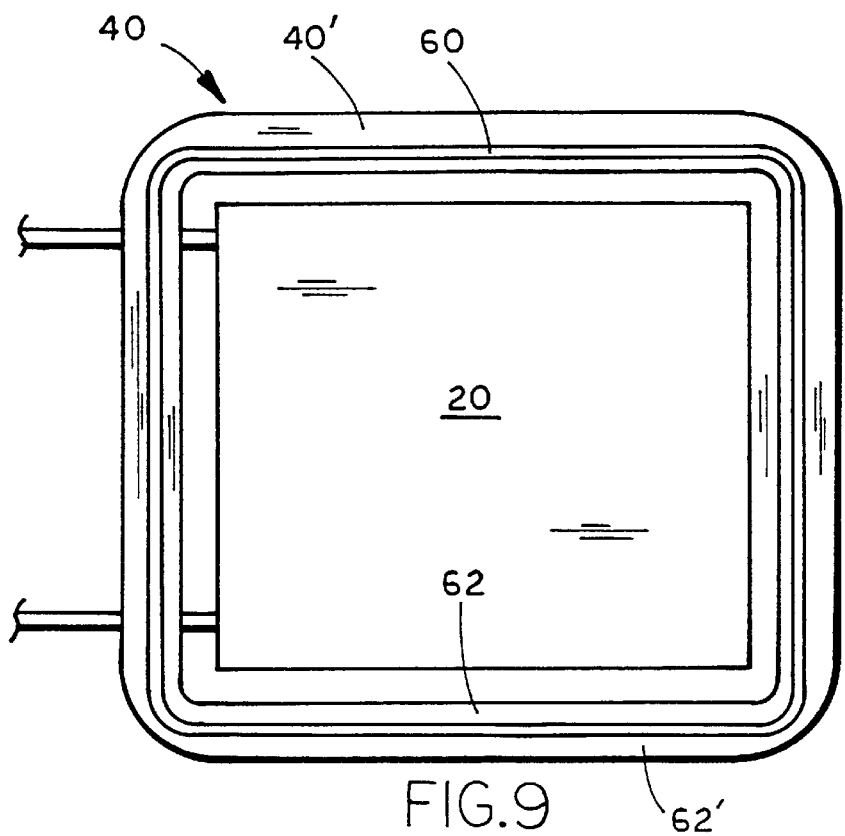
FIG. 9 is a plan view of the sealing member and thermoelectric module of FIG. 8.
Figure 10:
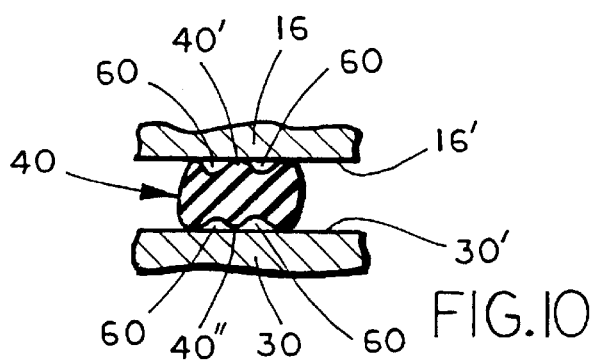
FIG. 10 is a sectional view of a sealing member according to another alternative preferred embodiment.

With reference to FIGS. 8 and 9, in an alternative preferred embodiment, contact surface 40' and 40" of sealing member 40 are each formed with a peripheral channel 60. The presence of channels 60 defines in each contact surface 40', 40" a pair of ridges 62, 62' which act as independent and distinct contact or sealing surfaces, while channel 60 effectively traps any water vapor which has penetrated outer ridge 62', and thereby prevents the water vapor from reaching thermoelectric module 20. As depicted in FIG. 9, there is one channel 60 in each contact surface 40', 40". However, it will be recognized by those with ordinary skill in the art that more than one channel 60 may be formed in each contact surface 40', 40", without departing from the spirit and scope of the invention. For example, as shown in FIG. 10, each contact surface 40', 40" may include two spaced channels 60 thereby defining three distinct ridges within each contact surface 40', 40". Furthermore, it will be recognized by those with ordinary skill in the art that sealing member 40, depicted in FIGS. 8 and 9, may be formed with wire guides 50, substantially as described above.

In assembling thermoelectric assembly 10, input fan 12 is coupled to cold sink 16 in any manner commonly utilized in the art. In addition, exhaust fan 35 is coupled to heat sink 30 in accordance with normal industry procedure. When sheaths 27 and/or wires 25 are to be molded to aperture 44 and/or central channel 52 of wire guides 50, wires 25, with or without sheaths 27, are first positioned in an appropriate mold configured to mold sealing member 40. Sealing member 40 is thereafter molded in accordance with normal industry procedure to thereby provide a hermetic seal between wires 25 and apertures 44 and/or wire guides 50. Alternatively, an appropriate sealing agent is placed in apertures 44, and/or central channel 52 to thereby seal wires 25 within apertures 44, and/or wire guides 50. Thereafter, wires 25 are attached to thermoelectric module 20 in accordance with normal industry procedure, while sealing member 40 and thermoelectric module 20 are positioned between contact surface 16' of cold sink 16 and contact surface 30' of heat sink 30. An appropriate lubricant or other sealing agent such as, for example, Dow Corning high vacuum grease, petroleum grease or oil, barium grease, or silicone grease or oil, may be placed between contact surfaces 16' and 30', and sealing member 40 to increase the reliability of the seal therebetween. When sealing member 40 is in position, fasteners 70, coupled to cold sink 16 and heat sink 30 are rotated, or otherwise moved in order to draw contact surface 16' and contact surface 30' towards one another. Securement of cold sink 16 to heat sink 30 by movement of fasteners 70 causes the compression of sealing member 40 to thereby provide a vapor-tight seal between sealing member 40, cold sink 16 and heat sink 30, and thus hermetically seal thermoelectric module 20.

As shown in FIGS. 2, 3, and 8, fasteners 70, which may be any fasteners commonly utilized in the art such as threaded screws and/or bolts with nuts and washers, are positioned beyond the periphery or outer surface 40''' of sealing member 40. The placement of the fasteners 70 beyond sealing member 40 eliminates the possibility of vapor introduction to thermoelectric module 20 caused by the placement of fastener 70 within the area 80 defined between sealing member 40 and thermoelectric module 20, or when fasteners 70 are placed through the sealing member. That is, due to the manufacturing tolerances of the apertures and threads used in conjunction with fasteners 70, any water vapor transported therethrough is prevented from contacting thermoelectric module 20 by sealing member 40.

Figure 15:
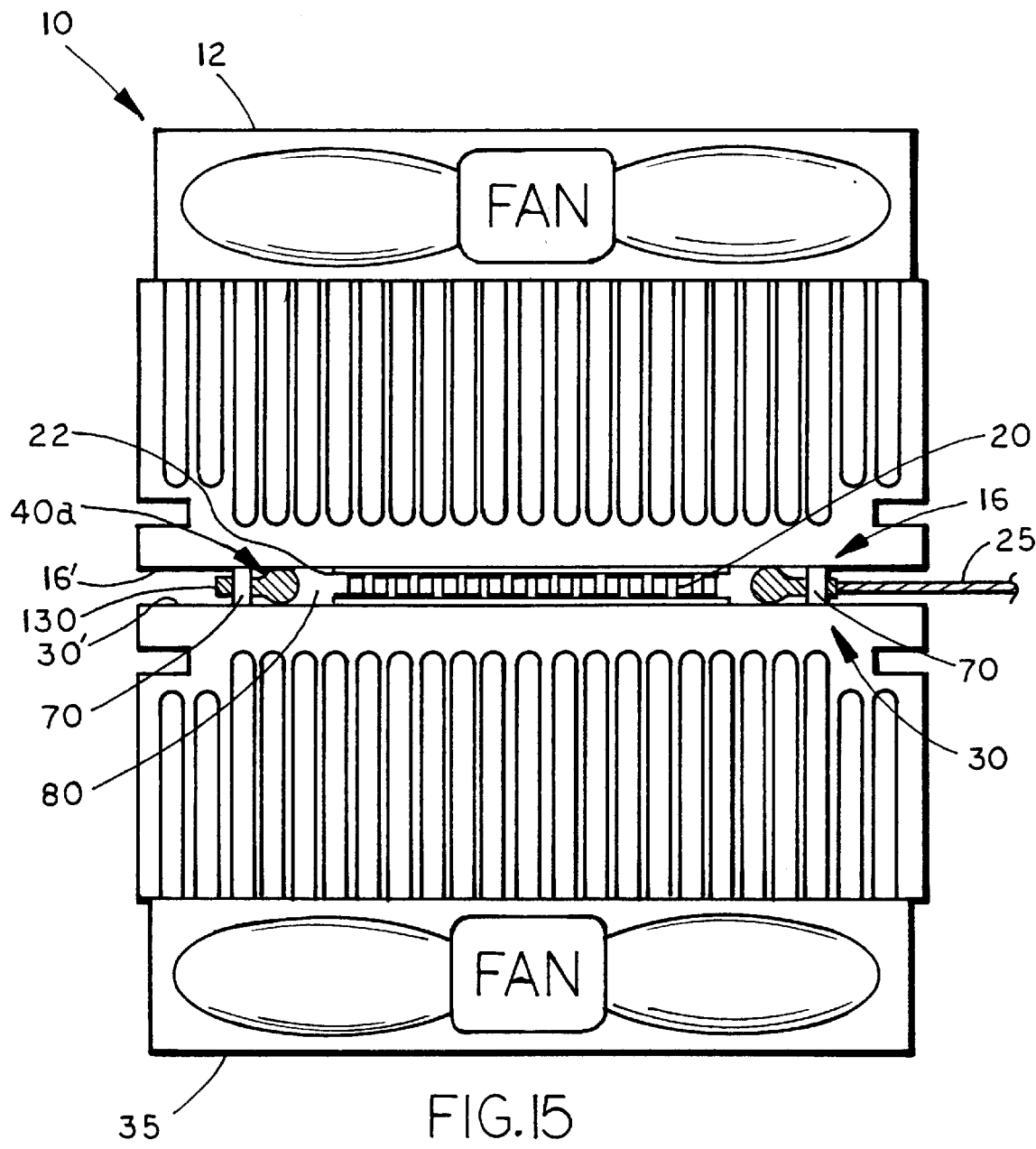
FIG. 15 is a cross-sectional view of the thermoelectric assembly of FIG. 14.
Figure 16:
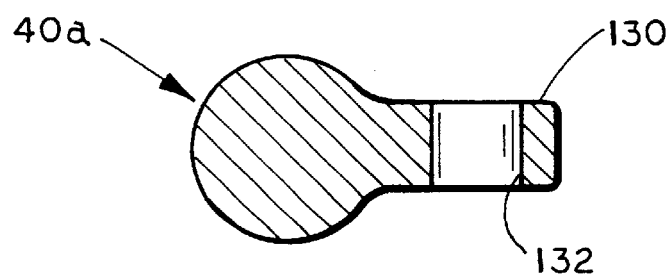
FIG. 16 is an enlarged sectional view of the sealing member taken along plane XVI—XVI of FIG. 14.

With reference to FIGS. 14–16, a further alternate embodiment 40a of the sealing member is shown in a thermoelectric assembly similar to that described above in connection with FIGS. 1 and 2. In this version, sealing member 40a is also positioned beyond the periphery 22 of thermoelectric module 20 and is in sealing contact with contact surface 16' of cold sink 16 and contact surface 30' of heat sink 30. Likewise, sealing member 40a is made of an elastomeric material having a low water vapor permeability such as from the materials described above and has a generally circular, uniform cross section and a pair of apertures 44 extending completely through the sealing member in a direction transverse to the axial extent of the sealing member, which apertures are formed of a substantially uniform cross section for sealing contact with the wires 25 passing therethrough. In addition, sealing member 40a includes a pair of indexing guides 130 formed on side sections of the sealing member such that the indexing guides extend in opposite directions as shown in FIGS. 14 and 15. Indexing guides 130 are molded integrally in one piece with sealing member 40a and are substantially annular and continuous forming a closure defining a through aperture 132 having an axis extending transverse to the plane of sealing member 40a as is shown in FIGS. 15 and 16. Apertures 132 are, thus, spaced immediately adjacent to the outer periphery of sealing member 40a such that fasteners 70, when received therethrough, draw heat sinks 16, 30 and contact surfaces 16', 30' tightly together against the oppositely facing, outer peripheries of the sealing member to ensure a secure, tight vapor seal of the sealing member between the contact surfaces. Apertures 132 are preferably aligned with the apertures extending in heat sinks 16, 30 for receiving fastener 70 and, thus, serve to locate and guide the positioning of the sealing member 40a such that its inner surfaces are spaced equidistantly from the periphery of thermoelectric module 20 to define space 80 therebetween. Indexing guides 130, thus, help position the sealing member 40a around the periphery of the thermoelectric module to avoid contact with the module while providing a tight, secure vapor seal.

It will be understood that the foregoing is a description of the preferred embodiments only. Those skilled in the art will recognize the variations, modifications, and improvements may be made without departing from the spirit and scope of the invention disclosed herein. The scope of protection is to be measured by the claims which follow in the breadth of interpretation which the law allows, including the doctrine of equivalents.

The embodiments in which an exclusive property right or privilege is claimed are defined as follows:

1. A thermoelectric assembly comprising:
    a thermoelectric module having a first surface and an opposing second surface, a periphery, and at least one electrical wire projecting therefrom;
    a first heat exchanger having an inner surface in contact with said first surface of said thermoelectric module;
    a second heat exchanger having an inner surface in contact with said second surface of said thermoelectric module;
    a sealing member positioned beyond the periphery of said thermoelectric module, said sealing member having a first sealing surface which sealingly engages said inner surface of said first heat exchanger, a second surface which sealingly engages said inner surface of said second heat exchanger, and an outer surface defining an outer periphery of said sealing member;
    a space between said first heat exchanger and said second heat exchanger created by said sealing engagement of said inner surface of said first heat exchanger and said inner surface of said second heat exchanger with said sealing member; and
    at least one fastener fastening said first heat exchanger to said second heat exchanger, said at least one fastener positioned beyond said outer periphery of said sealing member such that there is no fastener fastening said first heat exchanger to said second heat exchanger which is positioned inside said outer periphery of said sealing member;
    said at least one electrical wire extending along said space between said first and second heat exchangers and sealingly engaging and passing through and beyond said outer periphery of said sealing member whereby corrosion and/or degradation of said thermoelectric module due to intrusion of water vapor within said space is reduced.

2. The thermoelectric assembly of claim 1, wherein said at least one electrical wire engaging and passing through said sealing member comprises said sealing member being formed with at least one aperture therethough, said at least one aperture dimensioned to receive said at least one electrical wire therethrough, said aperture sealingly engaging said electrical wire.

3. The thermoelectric assembly of claim 3, wherein said sealing member further comprises at least one wire guide projecting from said sealing member in a direction away from said thermoelectric module, said wire guide having a central channel dimensioned for receipt of said at least one wire, said wire guide being in substantial registry with said at least one aperture.

4. The thermoelectric assembly of claim 3, wherein said wire guide has an end and said central channel has an enlarged diameter section extending from said end a preselected distance along said central channel.

5. The thermoelectric assembly of claim 3, further comprising a sealing agent between said central channel formed in said at least one wire guide and said at least one wire.

6. The thermoelectric assembly of claim 2, further comprising a sealing agent positioned between said at least one aperture and said at least one electrical wire.

7. The thermoelectric assembly of claim 1, wherein said sealing member is made of an elastomeric material having a low water vapor permeability.

8. The thermoelectric assembly of claim 7, wherein said elastomeric material is butyl rubber.

9. The thermoelectric assembly of claim 7, wherein said elastomeric material is a fluoroelastomer.

10. The thermoelectric assembly of claim 9, wherein said fluoroelastomer is a copolymer of vinylidene fluoride and hexafluoropropylene.

11. The thermoelectric assembly of claim 1, wherein said first sealing surface and said second sealing surface of said sealing member are each formed with at least two sealing surfaces.

12. The thermoelectric assembly of claim 11, wherein said at least two sealing surfaces define a channel therebetween.

13. The thermoelectric assembly of claim 1 wherein said sealing member includes at least one indexing guide positioned on said outer periphery, said indexing guide receiving said at least one fastener and facilitating the positioning and location of said sealing member with respect to said thermoelectric module in said assembly.

14. The thermoelectric assembly of claim 13 wherein said indexing guide is formed in one piece with said sealing member and includes an aperture extending therethrough for receiving said fastener.

15. The thermoelectric assembly of claim 13 wherein said sealing member includes a second indexing guide positioned on said outer periphery at a position spaced from said one indexing guide.

16. A thermoelectric assembly comprising:
   a thermoelectric module having a first surface and an opposing second surface, a periphery, and at least one electrical wire projecting therefrom;
   a first heat exchanger having an inner surface in contact with said first surface of said thermoelectric module;
   a second heat exchanger having an inner surface in contact with said second surface of said thermoelectric module; and
   a sealing member positioned about the periphery of said thermoelectric module, said sealing member having a first sealing surface which sealingly engages said inner surface of said first heat exchanger, and a second surface which sealingly engages said inner surface of said second heat exchanger, said sealing member formed with at least one aperture dimensioned to receive an electrical connector member in electrical connection with said at least one wire, said aperture defining a wall therearound, and wherein said electrical connector member is molded to said wall.

17. A sealing member for a thermoelectric assembly having a thermoelectric module with a periphery and at least one wire projecting therefrom, wherein the thermoelectric module is positioned between a first heat exchanger and a second heat exchanger, said sealing member comprising an elastomeric member having a low water vapor permeability and a thermally insulative filler material homogeneously dispersed therethrough, said elastomeric member adapted to be positioned beyond the periphery of the thermoelectric module, said elastomeric member having a first surface adapted to sealingly engage a surface of the first heat exchanger, and an opposing second surface adapted to sealingly engage a surface of the second heat exchanger, and at least one aperture extending through said elastomeric member, said at least one aperture dimensioned to receive the at least one wire, said aperture sealingly engaging said one wire.

18. A sealing member for a thermoelectric assembly having a thermoelectric module with a periphery and at least one wire projecting therefrom, wherein the thermoelectric module is positioned between a first heat exchanger and a second heat exchanger, said sealing member comprising an elastomeric member having a low water vapor permeability and a thermally insulative filler material homogeneously dispersed therethrough, said elastomeric member adapted to be positioned beyond the periphery of the thermoelectric module, said elastomeric member having a first surface adapted to sealingly engage a surface of the first heat exchanger, and an opposing second surface adapted to sealingly engage a surface of the second heat exchanger, and at least one aperture extending through said elastomeric member, said at least one aperture dimensioned to receive the at least one wire, said aperture sealingly engaging said one wire; said thermally insulative filler material comprising a plurality of microspheres formed from a thermally insulative material.

19. The sealing member of claim 18 wherein said microspheres are each hollow and contain a gas.

20. The sealing member of claim 19 wherein said microspheres are formed from a material selected from the group consisting of glass, plastic and ceramic.

* * * * *